(12) United States Patent
Kamei et al.

(10) Patent No.: US 8,748,903 B2
(45) Date of Patent: Jun. 10, 2014

(54) SEMICONDUCTOR LIGHT EMITTING ELEMENT AND METHOD FOR MANUFACTURING SEMICONDUCTOR LIGHT EMITTING ELEMENT

(75) Inventors: Koji Kamei, Ichihara (JP); Honglin Wang, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/505,973

(22) PCT Filed: Oct. 27, 2010

(86) PCT No.: PCT/JP2010/069075
§ 371 (c)(1),
(2), (4) Date: May 3, 2012

(87) PCT Pub. No.: WO2011/055664
PCT Pub. Date: May 12, 2011

(65) Prior Publication Data
US 2012/0217534 A1  Aug. 30, 2012

(30) Foreign Application Priority Data
Nov. 5, 2009  (JP) .................................. 2009-253928

(51) Int. Cl.
| | | |
|---|---|---|
| *H01L 27/15* | (2006.01) |
| *H01L 29/26* | (2006.01) |
| *H01L 31/12* | (2006.01) |
| *H01L 33/00* | (2010.01) |
| *H01L 29/06* | (2006.01) |
| *H01L 31/00* | (2006.01) |
| *H01L 21/00* | (2006.01) |

(52) U.S. Cl.
USPC .......... 257/79; 257/13; 257/94; 257/E33.062; 257/E33.063; 257/E33.064; 438/22

(58) Field of Classification Search
USPC ................ 257/13, 79, 94, E33.062, E33.063, 257/E33.064; 438/22
See application file for complete search history.

(56) References Cited

U.S. PATENT DOCUMENTS 6,521,998 B1 *  2/2003  Teraguchi et al. ............ 257/745
6,693,352 B1 *  2/2004  Huang et al. .................. 257/743
(Continued)

FOREIGN PATENT DOCUMENTS

JP    2007-053372 A    3/2007
JP    2008-16797 A     1/2008
(Continued)

*Primary Examiner* — Ida M Soward
(74) *Attorney, Agent, or Firm* — Sughrue Mion, PLLC

(57) ABSTRACT

A semiconductor light emitting element (1) provided with an n-type semiconductor layer (140), a light emitting layer (150), a p-type semiconductor layer (160), a transparent electrode (170), a p-side electrode (300) formed on the transparent electrode, and an n-side electrode (400) formed on the n-type semiconductor layer. The p-side electrode has a p-side joining layer (310) and a p-side bonding pad electrode (320), which are laminated on the transparent electrode, and the n-side electrode has an n-side joining layer (410) and an n-side bonding pad electrode (420), which are laminated on the n-type semiconductor layer. The p-side joining layer and the n-side joining layer are configured of a mixed layer composed of TaN and Pt, and the p-side bonding pad electrode and the n-side bonding pad electrode are configured of a laminated structure composed of Pt and Au.

8 Claims, 6 Drawing Sheets

(56) References Cited

U.S. PATENT DOCUMENTS

| | | | |
|---|---|---|---|
| 7,018,859 B2 * | 3/2006 | Liao et al. | 438/22 |
| 7,615,798 B2 * | 11/2009 | Sanga et al. | 257/99 |
| 7,714,341 B2 | 5/2010 | Chil Keun et al. | |
| 8,338,202 B2 | 12/2012 | Chinone et al. | |
| 2002/0071239 A1 * | 6/2002 | Nakabayashi et al. | 361/311 |
| 2003/0057444 A1 | 3/2003 | Niki et al. | |
| 2003/0189215 A1 * | 10/2003 | Lee et al. | 257/94 |
| 2004/0222499 A1 * | 11/2004 | Shibata et al. | 257/613 |
| 2004/0262621 A1 * | 12/2004 | Oh et al. | 257/79 |
| 2005/0001227 A1 | 1/2005 | Niki et al. | |
| 2005/0104080 A1 * | 5/2005 | Ichihara et al. | 257/98 |
| 2007/0034857 A1 | 2/2007 | Song | |
| 2007/0080353 A1 | 4/2007 | Lee et al. | |
| 2008/0006837 A1 | 1/2008 | Park et al. | |
| 2008/0035942 A1 | 2/2008 | Kim et al. | |
| 2008/0224168 A1 | 9/2008 | Lee et al. | |
| 2008/0303043 A1 | 12/2008 | Niki et al. | |
| 2009/0042328 A1 | 2/2009 | Niki et al. | |
| 2009/0085052 A1 * | 4/2009 | Ko et al. | 257/98 |
| 2009/0207872 A1 * | 8/2009 | Takei et al. | 372/44.01 |
| 2009/0239324 A1 | 9/2009 | Chinone et al. | |
| 2010/0136721 A1 | 6/2010 | Song | |
| 2010/0187556 A1 | 7/2010 | Kim et al. | |
| 2010/0200881 A1 * | 8/2010 | Masaki | 257/98 |
| 2010/0264445 A1 | 10/2010 | Niki et al. | |
| 2010/0264446 A1 | 10/2010 | Niki et al. | |
| 2010/0264447 A1 | 10/2010 | Niki et al. | |
| 2010/0266815 A1 | 10/2010 | Niki et al. | |
| 2010/0267181 A1 | 10/2010 | Niki et al. | |
| 2011/0018022 A1 | 1/2011 | Okabe et al. | |
| 2011/0084305 A1 | 4/2011 | Lee et al. | |
| 2011/0193060 A1 | 8/2011 | Lee et al. | |
| 2011/0303933 A1 * | 12/2011 | Yoo | 257/94 |
| 2012/0228664 A1 * | 9/2012 | Terano et al. | 257/99 |
| 2012/0261705 A1 | 10/2012 | Kim et al. | |

FOREIGN PATENT DOCUMENTS

| | | |
|---|---|---|
| JP | 2008-041866 A | 2/2008 |
| JP | 2008-42211 A | 2/2008 |
| JP | 2008-244503 A | 10/2008 |
| JP | 2009-200514 A | 9/2009 |
| JP | 2009-231478 A | 10/2009 |
| WO | 2009113659 A1 | 9/2009 |

* cited by examiner

FIG.6

| | COMPOSITION RATIO IN JOINING LAYER (mass%) Ta : Pt | N₂ GAS CONCENTRATION IN SPUTTERING GAS, N₂ / (Ar + N₂) (mol%) | THICKNESS OF JOINING LAYER (nm) | THE NUMBER OF OCCURRENCES OF PEELED ELECTRODES | N-SIDE ELECTRODE CONTACT RESISTIVITY NN ($\Omega \cdot cm^2$) | Vf (V) |
|---|---|---|---|---|---|---|
| EXAMPLE 1 | 90 : 10 | 2.5 | 4.0 | 8/300 | 0.0021 | 3.15 |
| EXAMPLE 2 | 75 : 25 | 2.5 | 4.0 | 5/300 | 0.0025 | 3.16 |
| EXAMPLE 3 | 50 : 50 | 10.0 | 4.0 | 2/300 | 0.0042 | 3.33 |
| EXAMPLE 4 | 50 : 50 | 7.5 | 4.0 | 1/300 | 0.0027 | 3.17 |
| EXAMPLE 5 | 50 : 50 | 5.0 | 4.0 | 0/300 | 0.0026 | 3.17 |
| EXAMPLE 6 | 50 : 50 | 2.5 | 1.0 | 2/300 | 0.0025 | 3.17 |
| EXAMPLE 7 | 50 : 50 | 2.5 | 4.0 | 4/300 | 0.0025 | 3.19 |
| EXAMPLE 8 | 50 : 50 | 2.5 | 10 | 0/300 | 0.0028 | 3.21 |
| EXAMPLE 9 | 50 : 50 | 2.5 | 40 | 1/300 | 0.0031 | 3.23 |
| EXAMPLE 10 | 50 : 50 | 2.5 | 100 | 1/300 | 0.0037 | 3.30 |
| EXAMPLE 11 | 50 : 50 | 0.0 | 4.0 | 0/300 | 0.0021 | 3.16 |
| EXAMPLE 12 | 40 : 60 | 2.5 | 4.0 | 0/300 | 0.0027 | 3.22 |
| EXAMPLE 13 | 30 : 70 | 2.5 | 4.0 | 0/300 | 0.0036 | 3.31 |
| EXAMPLE 14 | 90 : 10 | 0.0 | 4.0 | 7/300 | 0.0025 | 3.18 |
| COMPARATIVE EXAMPLE 1 | 100 : 0 | 2.5 | 2.0 | 49/300 | 0.0019 | 3.15 |
| COMPARATIVE EXAMPLE 2 | 0 : 100 | 2.5 | 4.0 | 3/300 | 0.0064 | 4.12 |

US 8,748,903 B2

SEMICONDUCTOR LIGHT EMITTING ELEMENT AND METHOD FOR MANUFACTURING SEMICONDUCTOR LIGHT EMITTING ELEMENT

CROSS REFERENCE TO RELATED APPLICATIONS

This application is a National Stage of International Application No. PCT/JP2010/069075 filed on Oct. 27, 2010, which claims priority from Japanese Patent Application No. 2009-253928, filed on Nov. 5, 2009, the contents of all of which are incorporated herein by reference in their entirety.

TECHNICAL FIELD

The present invention relates to a semiconductor light emitting element and a method for manufacturing the semiconductor light emitting element.

BACKGROUND ART

Recently, a GaN-based compound semiconductor has become a focus of attention as a semiconductor material for the short-wavelength light emitting element. The GaN-based compound semiconductor is formed by a metal organic chemical vapor deposition method (MOCVD method), a molecular beam epitaxy method (MBE method) or the like on a substrate composed of a sapphire single crystal, other various oxides or group III-V compounds.

In such a semiconductor light emitting element using the GaN-based compound semiconductor, generally, a laminated semiconductor layer having an LED structure constituted by an n-type semiconductor layer, a light emitting layer and a p-type semiconductor layer is formed on a substrate, and while a transparent electrode and an electrode pad for an external connection (p pad electrode) are formed on the p-type semiconductor layer as the top portion, another electrode pad for an external connection (n pad electrode) is formed on the n-type semiconductor layer that has been exposed by removing part of the p-type semiconductor layer and the light emitting layer by etching or the like.

As a related art disclosed in an official gazette, disclosed is a p pad electrode on the transparent electrode and an n pad electrode on the n-type nitride semiconductor layer, each of which is formed by a laminated structure composed of Au and Cr, and thereby the p pad electrode and n pad electrode have a common structure (refer to Patent Literature 1).

CITATION LIST

Patent Literature

Patent Literature 1: Japanese Patent Application Laid-Open Publication No. 2008-244503

SUMMARY OF INVENTION

Technical Problem

For manufacturing a light emitting apparatus or the like into which such a semiconductor light emitting element is incorporated, the p pad electrode and the n pad electrode provided in the semiconductor light emitting element are wire-bonded by use of a publicly known wire bonder. At the wire bonding, pressure is applied to each pad electrode for connecting a wire. However, after the wire bonding, each pad electrode may be peeled from the transparent electrode or a laminated body such as a semiconductor layer in some cases. In particular, the p pad electrode tends to have a weak joining property with the transparent electrode, and consequently peeling after the wire bonding often occurs.

In addition, in a case where the p pad electrode and the n pad electrode are constituted by a common structure, an ohmic contact is difficult to be formed at a connecting part between the n-type semiconductor layer and the n pad electrode, and consequently deterioration of electrical characteristics such as increase of forward voltage in the semiconductor light emitting element may occur in some cases.

An object of the present invention is to simplify configuration by forming two electrodes having a common structure, and to suppress deterioration of electrical characteristics of a semiconductor light emitting element while a joining property of each electrode is improved.

Solution to Problem

A semiconductor light emitting element to which the present invention is applied includes: a first semiconductor layer that has a first conductivity type; a light emitting layer that is laminated on one surface of the first semiconductor layer so that a part of the one surface is exposed; a second semiconductor layer that has a second conductivity type different from the first conductivity type and is laminated on the light emitting layer; a transparent electrode that includes oxide of indium, has transparency to light output from the light emitting layer, and is laminated on the second semiconductor layer; a first joining layer that includes Pt and nitride of at least one kind of metal selected from among Ta, Nb, Ti, W and Mo, and is laminated on the first semiconductor layer; a first connecting electrode that is laminated on the first joining layer, and is used for electric connection with an outside; a second joining layer that is composed of the same material as the first joining layer, and is laminated on the transparent electrode; and a second connecting electrode that is composed of the same material as the first connecting electrode, is laminated on the second joining layer, and is used for electric connection with an outside.

In such a semiconductor light emitting element, the transparent electrode contains the oxide of indium and oxide of zinc.

In addition, the first connecting electrode includes a first diffusion barrier layer that is composed of Pt, and is laminated on the first joining layer, and a first connecting electrode layer that is composed of Au or an alloy including Au, is laminated on the first diffusion barrier layer, and is used for the electric connection with the outside, and the second connecting electrode includes a second diffusion barrier layer that is composed of the same Pt as the first diffusion barrier layer, and is laminated on the second joining layer, and a second connecting electrode layer that is composed of the same Au or alloy including Au as the first connecting electrode layer, is laminated on the second diffusion barrier layer, and is used for the electric connection with the outside.

Further, the semiconductor light emitting element further includes: a first adhesive layer that includes at least one kind of metal selected from among Ta, Ti, Pt, Mo and Ni, and is laminated on a region of the first connecting electrode, except for a section used for the electric connection with the outside; a second adhesive layer that is composed of the same material as the first adhesive layer, and is laminated on a region of the second connecting electrode, except for a section used for the electric connection with the outside; and a protecting layer that is provided so as to cover the transparent electrode, the first adhesive layer and the second adhesive layer.

Furthermore, in a case where the first joining layer and the second joining layer include Pt and nitride of Ta, a composition ratio between the Ta and the Pt in each of the first joining layer and the second joining layer is in a range of 90:10 to 30:70 by weight.

From another point of view, a method for manufacturing a semiconductor light emitting element to which the present invention is applied includes: a process of forming, on a substrate, a first semiconductor layer that has a first conductivity type, a light emitting layer that is laminated on the first semiconductor layer, and a second semiconductor layer that has a second conductivity type opposite to the type of the first semiconductor layer and is laminated on the light emitting layer; a process of forming, on the second semiconductor layer, a transparent electrode that includes oxide of indium and has transparency to light output from the light emitting layer, and exposing the first semiconductor layer on the transparent electrode side; a process of laminating, on an exposed section of the first semiconductor layer, a first joining layer that includes Pt and nitride of at least one kind of metal selected from among Ta, Nb, Ti, W and Mo, and laminating, on the transparent electrode, a second joining layer that is composed of the same material as the first joining layer; and a process of laminating, on the first joining layer, a first connecting electrode that is used for electric connection with an outside, and laminating, on the second joining layer, a second connecting electrode that is composed of the same material as the first connecting electrode.

In such a method for manufacturing the semiconductor light emitting element, in the process of laminating the transparent electrode, a layer including the oxide of indium and oxide of zinc is laminated.

In addition, the process of laminating the first connecting electrode and the second connecting electrode includes: a process of laminating, on the first joining layer, a first diffusion barrier layer that is composed of Pt, and laminating, on the second joining layer, a second diffusion barrier layer that is composed of Pt; and a process of laminating, on the first diffusion barrier layer, a first connecting electrode layer that is composed of Au or an alloy including Au and is used for the electric connection with the outside, and laminating, on the second diffusion barrier layer, a second connecting electrode layer that is composed of Au or an alloy including Au and is used for electric connection with an outside.

Further, the method further includes: after the process of laminating the first connecting electrode and the second connecting electrode, a process of laminating a first adhesive layer that includes at least one kind of metal selected from among Ta, Ti, Pt, Mo and Ni, on a region of the first connecting electrode, except for a section used for the electric connection with the outside, and laminating a second adhesive layer that includes at least one kind of metal selected from among Ta, Ti, Pt, Mo and Ni, on a region of the second connecting electrode, except for a section used for the electric connection with the outside.

Furthermore, in a case where a layer including Pt and nitride of Ta is laminated as the first joining layer and the second joining layer in the process of forming the first joining layer and the second joining layer, a composition ratio between the Ta and the Pt in each of the first joining layer and the second joining layer is set to be in a range of 90:10 to 30:70 by weight.

Advantageous Effects of Invention

According to the present invention, it is possible to simplify configuration by forming two electrodes having a common structure, and to suppress deterioration of electrical characteristics of a semiconductor light emitting element while a joining property of each electrode is improved.

BRIEF DESCRIPTION OF DRAWINGS

FIG. 6 is a table showing configuration and manufacturing conditions of the p-side joining layer, and a relationship between the evaluation results, in examples and comparative examples.

DESCRIPTION OF EMBODIMENTS

An exemplary embodiment of the present invention will be described in detail below with reference to the accompanying drawings.

Figure 1:
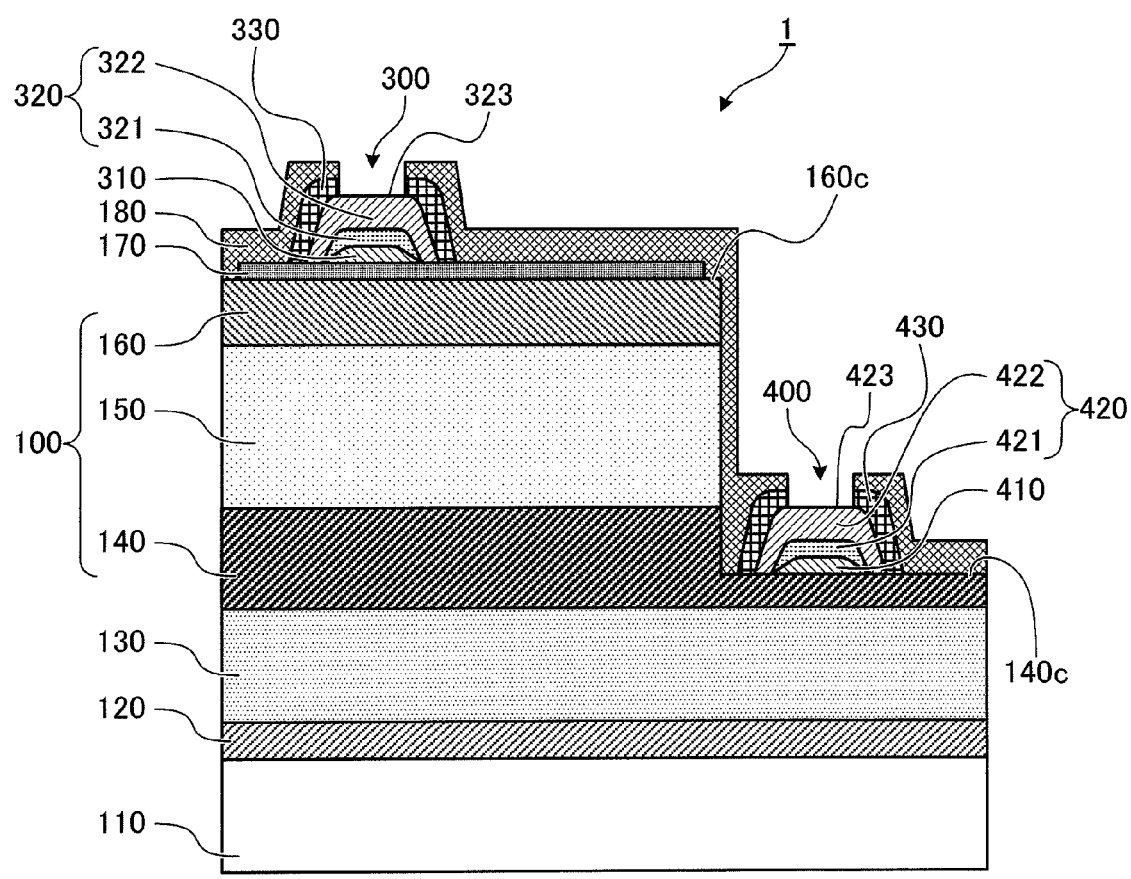
FIG. 1 shows an example of a schematic cross-sectional view of a semiconductor light emitting element.
Figure 2:
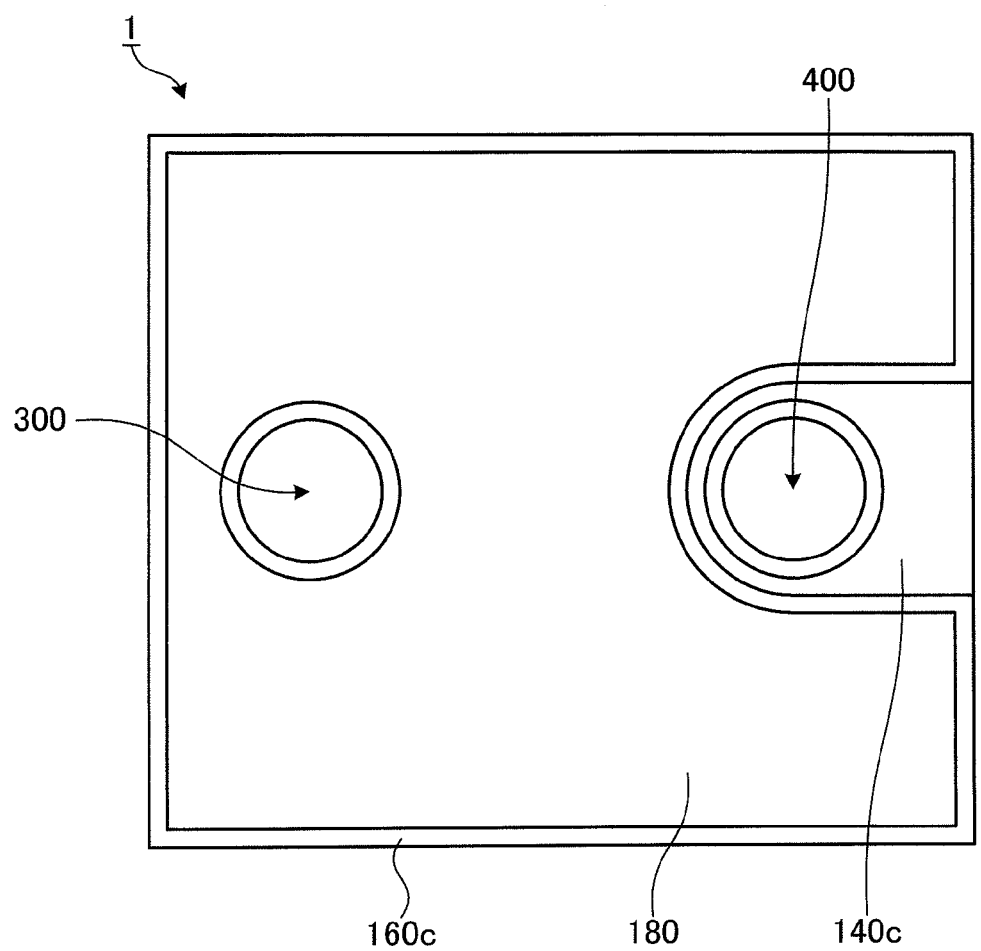
FIG. 2 shows an example of a schematic plan view of the semiconductor light emitting element.
Figure 3:
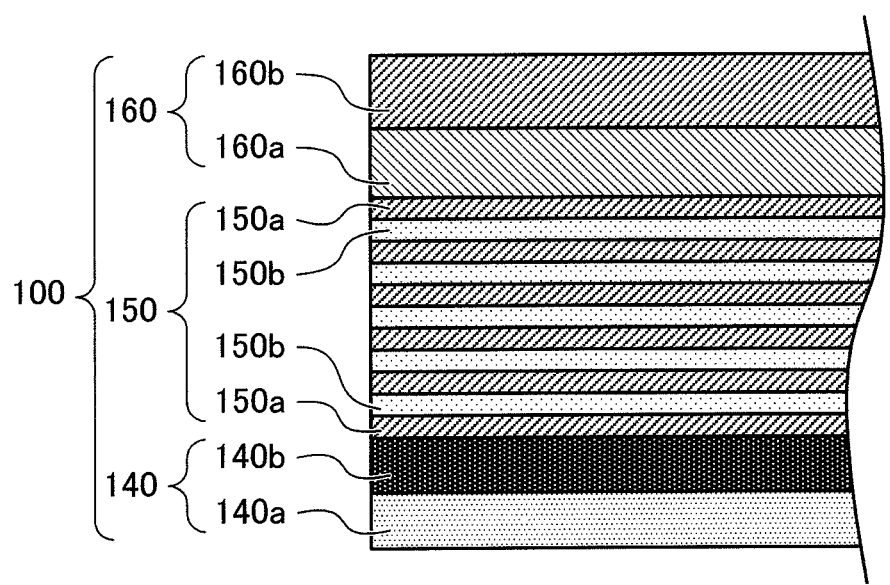
FIG. 3 shows an example of a schematic cross-sectional view of a laminated semiconductor layer that constitutes the semiconductor light emitting element.

FIG. 1 shows an example of a schematic cross-sectional view of a semiconductor light emitting element (light emitting diode) 1 to which the exemplary embodiment is applied, FIG. 2 shows an example of a schematic plan view of the semiconductor light emitting element 1 shown in FIG. 1, and FIG. 3 shows an example of a schematic cross-sectional view of a laminated semiconductor layer 100 that constitutes the semiconductor light emitting element 1.

(Semiconductor Light Emitting Element)

The semiconductor light emitting element 1 according to the exemplary embodiment includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. It should be noted that, in the following description, these n-type semiconductor layer 140, light emitting layer 150 and p-type semiconductor layer 160 are collectively referred to as the laminated semiconductor layer 100 as necessary.

The semiconductor light emitting element 1 further includes: a transparent electrode 170 formed on the p-type semiconductor layer 160; and a p-side electrode 300 laminated on a part of the transparent electrode 170.

Still further, the semiconductor light emitting element 1 includes an n-side electrode 400 laminated on a part of a semiconductor layer exposure surface 140c of the n-type semiconductor layer 140, which is exposed by cutting out a part of each of the p-type semiconductor layer 160, the light emitting layer 150 and the n-type semiconductor layer 140.

The semiconductor light emitting element 1 further includes a protecting layer 180 laminated to cover a region of the transparent electrode 170 on which the p-side electrode 300 is not attached, a region of the p-side electrode 300 except for a part (a p-side connecting surface 323, which will be described later), a region of the semiconductor layer exposure surface 140c on which the n-side electrode 400 is not attached, and a region of the n-side electrode 400 except for a part (an n-side connecting surface 423, which will be described later). It should be noted that the protecting layer 180 also covers wall surfaces of the n-type semiconductor layer 140, the light emitting layer 150 and the p-type semiconductor layer 160, which have been exposed by cutting out a part of each of the p-type semiconductor layer 160, the light emitting layer 150 and the n-type semiconductor layer 140.

Moreover, the p-side electrode 300 includes: a p-side joining layer 310 laminated on the transparent electrode 170; a p-side bonding pad electrode 320 laminated on the p-side joining layer 310, a part of which is not covered with the protecting layer 180 to form the p-side connecting surface 323 that is thereby exposed to the outside; and a p-side adhesive layer 330 that is laminated on a part of the p-side bonding pad electrode 320 except for the p-side connecting surface 323, and that has a surface opposite to the laminated surface, on which the protecting layer 180 is laminated. The p-side bonding pad electrode 320 includes a p-side diffusion barrier layer 321 laminated on the p-side joining layer 310 and a p-side connecting electrode layer 322 laminated on the p-side diffusion barrier layer 321, on a part of which the p-side adhesive layer 330 is laminated to form the p-side connecting surface 323.

On the other hand, the n-side electrode 400 includes: an n-side joining layer 410 laminated on the n-type semiconductor layer 140; an n-side bonding pad electrode 420 laminated on the n-side joining layer 410, a part of which is not covered with the protecting layer 180 to form the n-side connecting surface 423 that is thereby exposed to the outside; and an n-side adhesive layer 430 that is laminated on a part of the n-side bonding pad electrode 420 except for the n-side connecting surface 423, and that has a surface opposite to the laminated surface, on which the protecting layer 180 is laminated. The n-side bonding pad electrode 420 includes an n-side diffusion barrier layer 421 laminated on the n-side joining layer 410, and an n-side connecting electrode layer 422 laminated on the n-side diffusion barrier layer 421, on a part of which the n-side adhesive layer 430 is laminated to form the n-side connecting surface 423.

In the semiconductor light emitting element 1, the light emitting layer 150 is configured to emit light by setting the p-side bonding pad electrode 320 in the p-side electrode 300 as a positive electrode and the n-side bonding pad electrode 420 in the n-side electrode 400 as a negative electrode to make a current flow from the p-side electrode 300 to the n-side electrode 400 through both of them.

Next, each constituent of the semiconductor light emitting element 1 will be described in more detail.

<Substrate>

As the substrate 110, there is no particular limitation on any substrate as long as group III nitride semiconductor crystals are epitaxially grown on a surface thereof, and accordingly, various kinds of substrate can be selected and used. The substrate 110 composed of, for example, sapphire, SiC, silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum or the like can be used.

Moreover, among the above-described substrates, it is preferable to use a sapphire substrate whose chamfer is a principal surface. In the case where the sapphire substrate is used, the intermediate layer 120 (buffer layer) may be formed on the chamfer of sapphire.

<Laminated Semiconductor Layer>

The laminated semiconductor layer 100 is composed of, for example, the group III nitride semiconductor, which is configured by laminating the n-type semiconductor layer 140, the light emitting layer 150 and the p-type semiconductor layer 160 on the substrate 110 in this order as shown in FIG. 1. Here, the n-type semiconductor layer 140 serving as an example of a first semiconductor layer uses, as carriers, electrons serving as an example of a first conductivity type. Meanwhile, the p-type semiconductor layer 160 serving as an example of a second semiconductor layer uses, as carriers, holes serving as an example of a second conductivity type.

Further, as shown in FIG. 3, each of the n-type semiconductor layer 140, the light emitting layer 150 and the p-type semiconductor layer 160 may be configured by plural semiconductor layers. Moreover, the laminated semiconductor layer 100 may further include the base layer 130 and the intermediate layer 120.

It should be noted that the laminated semiconductor layer 100 with excellent crystallinity can be obtained by forming the laminated semiconductor layer 100 by an MOCVD method. However, a sputtering method under optimized conditions can form a semiconductor layer having more excellent crystallinity than that formed by the MOCVD method. Hereinafter, descriptions will be sequentially given.

<Intermediate Layer>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

As described above, the intermediate layer 120 can be, for example, composed of polycrystal $Al_xGa_{1-x}N$ ($0 \leq x \leq 1$) with a thickness of 0.01 μm to 0.5 μm. If the thickness of the intermediate layer 120 is less than 0.01 μm, there are some cases where an effect of the intermediate layer 120 to reduce the difference in lattice constant between the substrate 110 and the base layer 130 cannot be sufficiently obtained. On the other hand, if the thickness of the intermediate layer 120 is more than 0.5 μm, there is a possibility that the time of the layer forming process of the intermediate layer 120 becomes longer though there is no change in the function of the intermediate layer 120, and accordingly the productivity is decreased.

The intermediate layer 120 has a function of reducing the difference in lattice constant between the substrate 110 and the base layer 130 to facilitate the formation of a single crystal layer which is c-axis oriented on the (0001) surface (chamfer) of the substrate 110 particularly in a case where the substrate 110 is composed of sapphire having the chamfer as a principal surface. Consequently, if a single crystal base layer 130 is laminated on the intermediate layer 120, the base layer 130 having more excellent crystallinity can be laminated. It should be noted that the intermediate layer 120 is preferably formed in the present invention, but not necessarily needed.

Further, the intermediate layer 120 may have a crystal structure of a hexagonal system composed of a group III nitride semiconductor. Moreover, the crystal of the group III nitride semiconductor constituting the intermediate layer 120 may have a single crystal structure, and those having a single crystal structure are preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having a single crystal structure by controlling layer forming conditions of the intermediate layer 120. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

Furthermore, it is possible to provide the group III nitride semiconductor crystals constituting the intermediate layer 120 as columnar crystals (polycrystals) composed of a texture based on hexagonal columns by controlling layer forming conditions. It should be noted that the columnar crystals composed of a texture described here refer to crystals which are separated from adjacent crystal grains by crystal grain boundaries formed therebetween, and are columnar by themselves in a longitudinal sectional shape.

<Base Layer>

As the base layer 130, $Al_xGa_yIn_zN$ ($0 \le x \le 1$, $0 \le y \le 1$, $0 \le z \le 1$, $x+y+z=1$) can be used, but it is preferable to use $Al_xGa_{1-x}N$ ($0 \le x < 1$) because the base layer 130 with excellent crystallinity can be formed.

The thickness of the base layer 130 is preferably 0.1 μm or more, more preferably 0.5 μm or more, and most preferably 1 μm or more. The base layer 130 having excellent crystallinity is likely to be obtained with these layer thickness or more.

To improve the crystallinity of the base layer 130, it is desirable that the base layer 130 is not doped with impurities. However, if conductivity of p-type or n-type is needed, acceptor impurities or donor impurities can be added.

<N-Type Semiconductor Layer>

As shown in FIG. 3, the n-type semiconductor layer 140 is preferably configured with an n-contact layer 140a and an n-cladding layer 140b. It should be noted that the n-contact layer 140a can also serve as the n-cladding layer 140b. Further, the aforementioned base layer 130 may be included in the n-type semiconductor layer 140.

The n-contact layer 140a is a layer for providing the n-side electrode 400 (refer to FIG. 1). The n-contact layer 140a is preferably configured with the $Al_xGa_{1-x}N$ layer ($0 \le x < 1$, more preferably $0 \le x \le 0.5$, and still more preferably $0 \le x \le 0.1$).

Further, the n-contact layer 140a is preferably doped with n-type impurities, and preferably contains the n-type impurities having a concentration of $1 \times 10^{17}/cm^3$ to $1 \times 10^{20}/cm^3$, and preferably a concentration of $1 \times 10^{18}/cm^3$ to $1 \times 10^{19}/cm^3$ on the point that a good ohmic contact with the n-side electrode 400 can be maintained. The n-type impurities are not particularly limited. However, Si, Ge, Sn and so on are provided, and Si and Ge are preferably provided.

The thickness of the n-contact layer 140a is preferably set at 0.5 μm to 5 μm, and more preferably set in a range of 1 μm to 3 μm. If the thickness of the n-contact layer 140a is in the above-described ranges, crystallinity of the light emitting layer 150 and the like are suitably maintained.

It is preferable to provide the n-cladding layer 140b between the n-contact layer 140a and the light emitting layer 150. The n-cladding layer 140b is a layer for performing injection of the carriers into the light emitting layer 150 and confinement of the carriers. The n-cladding layer 140b can be formed of AlGaN, GaN, GaInN and so on. The hetero junction structure or the superlattice structure in which the layer is laminated plural times of these structures may also be used. When the n-cladding layer 140b is formed of GaInN, it is obvious that the band gap thereof is preferably larger than that of GaInN of the light emitting layer 150. It should be noted that, in this description, AlGaN, GaN and GaInN may be shown with composition ratios thereof omitted in some cases.

The thickness of the n-cladding layer 140b is not particularly limited, but preferably in a range of 0.005 μm to 0.5 μm, and more preferably in a range of 0.005 μm to 0.1 μm. The n-type impurity concentration of the n-cladding layer 140b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the impurity concentration in these ranges in terms of maintaining excellent crystallinity and reducing operation voltage of the element.

It should be noted that, in the case where the n-cladding layer 140b is a layer containing the superlattice structure, the layer may contain a structure in which an n-side first layer composed of the group III nitride semiconductor with a thickness of 10 nm or less and an n-side second layer having a different composition from the n-side first layer and composed of the group III nitride semiconductor with a thickness of 10 nm or less are laminated, though detailed illustration thereof is omitted.

Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

<Light Emitting Layer>

As the light emitting layer 150 laminated on the n-type semiconductor layer 140, a single quantum well structure or a multiple quantum well structure can be employed. In the exemplary embodiment, as shown in FIG. 3, the light emitting layer 150 is formed by a multiple quantum well structure in which barrier layers 150a and well layers 150b are alternately laminated. In the light emitting layer 150, the barrier layers 150a are respectively formed on sides where the light emitting layer 150 is in contact with the n-cladding layer 140b and a p-cladding layer 160a.

As a well layer 150b having a quantum well structure as shown in FIG. 3, the group III nitride semiconductor layer composed of $Ga_{1-y}In_yN$ ($0 < y < 0.4$) is usually used. The thickness of the well layer 150b may be the thickness by which quantum effects can be obtained, for example, 1 nm to 10 nm, and is preferably 2 nm to 6 nm in terms of light emission output.

Moreover, in the case of the light emitting layer 150 having the multiple quantum well structure, the above-described $Ga_{1-y}In_yN$ is employed as the well layer 150b, and $Al_zGa_{1-z}N$ ($0 \le z < 0.3$) having a band gap energy larger than that of the well layer 150b is employed as the barrier layer 150a. The well layer 150b and the barrier layer 150a may be doped or not doped with impurities depending upon a design thereof.

<P-Type Semiconductor Layer>

As shown in FIG. 3, the p-type semiconductor layer 160 is usually configured with the p-cladding layer 160a and a p-contact layer 160b. Further, the p-contact layer 160b can also serve as the p-cladding layer 160a.

The p-cladding layer 160a is a layer for performing confinement of carriers within the light emitting layer 150 and injection of carriers. The p-cladding layer 160a is not particularly limited as long as the band gap energy of the composition thereof is larger than that of the light emitting layer 150 and carriers can be confined within the light emitting layer 150, but is composed of $Al_xGa_{1-x}N$ ($0 < x \le 0.4$) for example.

It is preferable that the p-cladding layer 160a is composed of such AlGaN in terms of confinement of carriers within the light emitting layer 150. The thickness of the p-cladding layer 160a is not particularly limited, but preferably 1 nm to 400 nm, and more preferably 5 nm to 100 nm.

The p-type impurity concentration of the p-cladding layer 160a is preferably $1 \times 10^{18}/cm^3$ to $1 \times 10^{21}/cm^3$, and more preferably $1\times10^{19}$/cm$^3$ to $1\times10^{20}$/cm$^3$. If the p-type impurity concentration is in the above ranges, excellent p-type crystals can be obtained without deteriorating crystallinity.

Further, the p-cladding layer 160a may have a superlattice structure similarly to the aforementioned n-cladding layer 140b, and in this case, preferably has an alternating structure of AlGaN and AlGaN having different composition ratios or an alternating structure of AlGaN and GaN as different compositions.

The p-contact layer 160b is a layer for providing the p-side electrode 300 through the transparent electrode 170. The p-contact layer 160b is preferably composed of $Al_xGa_{1-x}N$ (0≤x≤0.4). It is preferable that Al composition is in the above-described range in terms of allowing to maintain excellent crystallinity and good ohmic contact with the p-side electrode 300.

In the p-contact layer 160b, it is preferable to contain p-type impurities having a concentration of $1\times10^{18}$/cm$^3$ to $1\times10^{21}$/cm$^3$, and more preferably $5\times10^{19}$/cm$^3$ to $5\times10^{20}$/cm$^3$ in terms of maintaining good ohmic contact, preventing cracking and maintaining excellent crystallinity. The p-type impurities are not particularly limited, but, for example, Mg is preferably provided.

The thickness of the p-contact layer 160b is not particularly limited, but is preferably 0.01 μm to 0.5 μm, and more preferably 0.05 μm to 0.2 μm. It is preferable to provide the thickness of the p-contact layer 160b in these ranges in terms of light emission output.

<Transparent Electrode>

As shown in FIG. 1, the transparent electrode 170 is laminated on the p-type semiconductor layer 160.

As shown in FIG. 2, when the semiconductor light emitting element 1 is viewed in a planar view, the transparent electrode 170 (refer to FIG. 1) is formed to cover almost all of a top surface 160c of the p-type semiconductor layer 160, a part of which has been removed by means of etching or the like so as to form the n-side electrode 400. However, the transparent electrode 170 is not limited to such a shape, but may be formed in lattice patterns or tree patterns with some spaces in between. It should be noted that, as the structure of the transparent electrode 170, any structure including those publicly known can be used without any limitation.

It is preferable that the transparent electrode 170 has a small contact resistance with the p-type semiconductor layer 160. Further, in the semiconductor light emitting element 1, since the light from the light emitting layer 150 is extracted to the side on which the p-side electrode 300 is formed, it is preferable that the transparent electrode 170 has excellent transparency to the light emitted from the light emitting layer 150. Further, for uniformly passing a current over the entire surface of the p-type semiconductor layer 160, it is preferable that the transparent electrode 170 has excellent conductivity.

From above, as the material of the transparent electrode 170, it is preferable to use a conductive material having optical transparency composed of conductive oxide at least containing In. Examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

The transparent electrode 170 can be formed by providing these materials by any well-known method in this technical field. Moreover, there are some cases where thermal annealing is performed for improving transparency of the transparent electrode 170 after forming the transparent electrode 170.

In the exemplary embodiment, as the transparent electrode 170, a crystallized structure may be used, and in particular, a transparent material containing an $In_2O_3$ crystal having a crystal structure of a hexagonal system or a bixbyite structure (for example, ITO or IZO) can be preferably used.

For instance, in the case where IZO containing the $In_2O_3$ crystal having a crystal structure of a hexagonal system is used as the transparent electrode 170, an amorphous IZO film that has an excellent etching property can be used and processed into a specific shape, and thereafter, processed into an electrode that is superior in optical transparency than the amorphous IZO film by transferring the amorphous state into a structure containing crystals through a heat treatment or the like. The thickness of the transparent electrode 170 is not particularly limited, but may be in the range of, for example, 10 nm to 500 nm.

<Protecting Layer>

The protecting layer 180 is provided to suppress entry of water or the like into the inside of the semiconductor light emitting element 1. Further, in the exemplary embodiment, since the light from the light emitting layer 150 is extracted through the protecting layer 180, it is desirable that the protecting layer 180 has excellent transparency to the light emitted from the light emitting layer 150. Accordingly, in the exemplary embodiment, the protecting layer 180 is configured with $SiO_2$. However, the material constituting the protecting layer 180 is not limited thereto, and $TiO_2$, $Si_3N_4$, $SiO_2$—$Al_2O_3$, $Al_2O_3$, AlN or the like may be employed in place of $SiO_2$.

<P-Side Electrode>

Next, configuration of the p-side electrode 300 will be described in detail. As described above, the p-side electrode 300 includes: the p-side joining layer 310; the p-side bonding pad electrode 320 (the p-side diffusion barrier layer 321 and the p-side connecting electrode layer 322); and the p-side adhesive layer 330. The p-side electrode 300 also serves as a so-called bonding pad, and is configured so that a bonding wire not shown in the figure is connected to the p-side connecting surface 323 that is exposed to the outside.

In the example shown in FIG. 1, the p-side electrode 300 is provided on a flat surface of the transparent electrode 170, however, it may be possible to form a concave portion in the transparent electrode 170 and provide the p-side electrode 300 on a bottom surface of the concave portion. It should be noted that, in this example, in a planar view as shown in FIG. 2, the p-side electrode 300 shows a circular shape. However, the shape is not limited thereto and it is possible to select any shape such as a polygon.

<P-Side Joining Layer>

The p-side joining layer 310 serving as an example of a second joining layer is provided between the transparent electrode 170 and the p-side bonding pad electrode 320 for increasing joint strength of the p-side bonding pad electrode 320 with respect to the transparent electrode 170 and for ensuring ohmic contact between the transparent electrode 170 and the p-side bonding pad electrode 320.

The p-side joining layer 310 in the exemplary embodiment is formed of a mixed layer composed of TaN obtained by nitriding Ta, and Pt (referred to as a TaN—Pt mixed layer in the description below). Thereby, joint strength of the p-side bonding pad electrode 320 with respect to the transparent electrode 170 is increased and ohmic contact between the transparent electrode 170 and the p-side bonding pad electrode 320 is ensured. The detailed description thereof will be given later.

Here, in the case where the p-side joining layer 310 is configured with the TaN—Pt mixed layer, the ratio between Ta and Pt (Ta:Pt) in the p-side joining layer 310 is desirably in a range of 90:10 to 30:70 in percent by weight (wt %). In a case where the ratio of Ta is too high, joint strength of the p-side bonding pad electrode 320 with respect to the transparent electrode 170 tends to be decreased. On the other hand, in a case where the ratio of Pt is too high, it is difficult to ensure ohmic contact between the transparent electrode 170 and the p-side bonding pad electrode 320.

It should be noted that, in the case where the p-side joining layer 310 is configured with the TaN—Pt mixed layer, the composition ratio between Ta and Pt may be changed in the layer-thickness direction. However, in this case, it is desirable that the ratio of Ta at the side near the transparent electrode 170 is lower than that at the side farther from the transparent electrode 170.

Further, the thickness of the p-side joining layer 310 is desirably selected from a range of 1 nm to 100 nm. If the thickness of the p-side joining layer 310 is smaller than 1 nm, effect of increasing joint strength of the p-side bonding pad electrode 320 with respect to the transparent electrode 170 may not be sufficiently obtained. On the other hand, if the thickness of the p-side joining layer 310 is larger than 100 nm, the time of the layer forming process of the p-side joining layer 310 becomes longer in spite of no change in the function as the p-side joining layer 310, and thereby it is feared that the productivity may be decreased.

It should be noted that, in this example, the p-side joining layer 310 is configured with the TaN—Pt mixed layer. However, Nb, Ti, W, or Mo can be used in place of Ta. That is, the p-side joining layer 310 can be configured with a mixed layer composed of NbN obtained by nitriding Nb, and Pt (referred to as a NbN—Pt mixed layer in the description below), a mixed layer composed of TiN obtained by nitriding Ti, and Pt (referred to as a TiN—Pt mixed layer in the description below), a mixed layer composed of WN obtained by nitriding W, and Pt (referred to as a WN—Pt mixed layer in the description below), or a mixed layer composed of MoN obtained by nitriding Mo, and Pt (referred to as a MoN—Pt mixed layer in the description below).

Although the p-side joining layer 310 is configured with the TaN—Pt mixed layer, it is not essential to nitride Ta, and accordingly, for example, the p-side joining layer 310 can be configured with a mixed layer of Ta and Pt (referred to as a Ta—Pt mixed layer in the description below). Also in the case where the p-side joining layer 310 is configured with the Ta—Pt mixed layer, the ratio between Ta and Pt (Ta:Pt) in the p-side joining layer 310 is desirably in a range of 90:10 to 30:70 in percent by weight (wt %).

Although the p-side joining layer 310 is configured with the TaN—Pt mixed layer, it is not essential to nitride Ta, and accordingly, for example, the p-side joining layer 310 can be configured with a mixed layer of TaO as an oxide and Pt (referred to as a TaO—Pt mixed layer in the description below). Also in the case where the p-side joining layer 310 is configured with the TaO—Pt mixed layer, the ratio between Ta and Pt (Ta:Pt) in the p-side joining layer 310 is desirably in a range of 90:10 to 30:70 in percent by weight (wt %). It should be noted that, oxygen (O) of TaO is obtained by involvement of oxygen in the sputtering device, movement of oxygen (O) of oxide composing the transparent electrode or the like, and thereby, for example, the TaO—Pt mixed layer is formed. Instead, a TaN—TaO—Pt mixed layer may be formed by involvement of oxygen in the sputtering device, movement of oxygen (O) of oxide composing the transparent electrode, or the like.

<P-Side Bonding Pad Electrode>

The p-side bonding pad electrode 320 as an example of a second connecting electrode has a configuration in which the p-side diffusion barrier layer 321 and the p-side connecting electrode layer 322 are laminated in this order from the p-side joining layer 310 side. Here, the p-side diffusion barrier layer 321 has a function for suppressing a migration of elements forming the p-side joining layer 310 (in this example, particularly indicating Ta) and a function for suppressing a migration of elements forming the p-side connecting electrode layer 322 (in this example, Au which will be described later). The p-side connecting electrode layer 322 has a function for enhancing adhesiveness with a material of a relay terminal for power supply.

<P-Side Diffusion Barrier Layer>

The p-side diffusion barrier layer 321 as an example of a second diffusion barrier layer has a function for enhancing strength of the p-side bonding pad electrode 320 as a whole in addition to the aforementioned function for preventing the migrations. Accordingly, a relatively hard metallic material is preferably used, and thus, for example, any one of Ag, Al, Ru, Rh, Pd, Os, Ir, Pt, Ti, W, Mo, Ni, Co, Zr, Hf, Ta and Nb or an alloy including any of these metals can be selected. Among them, Al, Ag, and Pt, and an alloy including at least any one of these metals are commonly used as a material for electrodes, they are excellent in ease in availability, handling and the like, and in particular, Pt is preferable.

The thickness of the p-side diffusion barrier layer 321 is desirably selected from a range of 20 nm to 500 nm. If the thickness of the p-side diffusion barrier layer 321 is thinner than 20 nm, effect for suppressing the migrations is difficult to be obtained. On the other hand, if the thickness of the p-side diffusion barrier layer 321 is thicker than 500 nm, no specific advantage is obtained, and it is feared that processed time may be longer and the material thereof may be wasted. A further desirable thickness of the p-side diffusion barrier layer 321 is in a range of 50 nm to 200 nm.

Further, the p-side diffusion barrier layer 321 is preferably in close contact with the p-side joining layer 310 in terms of increasing joint strength between the p-side bonding pad electrode 320 and the transparent electrode 170. In order that the p-side bonding pad electrode 320 may obtain sufficient joint strength, it is necessary for the p-side diffusion barrier layer 321 to be tightly joined with the transparent electrode 170 through the p-side joining layer 310. The p-side bonding pad electrode 320 preferably has strength enough to avoid peeling in a process in which a gold wire is connected to the bonding pad by a general method, at the minimum.

<P-Side Connecting Electrode Layer>

The p-side connecting electrode layer 322 as an example of a second connecting electrode layer is preferably made of Au or an alloy containing Au. Since Au is a metal having excellent adhesiveness with a gold ball that is often used as a bonding ball, excellent adhesiveness with the bonding wire can be obtained by using Au or an alloy containing Au.

The thickness of the p-side connecting electrode layer 322 is preferably 50 nm or more but not more than 2000 nm, and more preferably 500 nm or more but not more than 1500 nm.

If the p-side connecting electrode layer 322 is thinner than 50 nm, poor adhesiveness with the bonding ball is caused. If the p-side connecting electrode layer 322 is thicker than 1500 nm, there is no specific advantage, and it may cause an increase in cost.

The p-side joining layer 310 and the p-side bonding pad electrode 320 laminated thereon can be formed anywhere as long as they are formed on the transparent electrode 170. For example, they may be formed at a position farthest from the n-side electrode 400, a center of the semiconductor light emitting element 1, or the like. However, if they are formed at a position that is too close to the n-side electrode 400, it is not preferable since a short circuit between wires or balls is caused at bonding.

A bonding operation is more easily performed if an electrode area of the p-side bonding pad electrode 320, specifically, the area of the p-side connecting surface 323 as a top surface of the p-side connecting electrode layer 322, is as large as possible. However, it prevents light emission from being extracted. For example, if an area exceeding a half of an area of the chip surface is covered, it prevents light emission from being extracted, and output notably decreases. If the area is too small, the bonding operation is difficult to be performed, and a product yield is decreased.

Specifically, it is preferable that the p-side connecting surface 323 is slightly larger than the diameter of the bonding ball, and it is generally formed into a circle having a diameter of about 100 μm.

<P-Side Adhesive Layer>

The p-side adhesive layer 330 as an example of a second adhesive layer is laminated between the p-side bonding pad electrode 320 and the protecting layer 180 for increasing joining strength of the p-side bonding pad electrode 320 with respect to the protecting layer 180.

As described in the exemplary embodiment, in the case where the p-side connecting electrode layer 322 of the p-side bonding pad electrode 320 is composed of Au and the protecting layer 180 is composed of $SiO_2$, the p-side adhesive layer 330 formed therebetween is preferably composed of Ta. Incidentally, the p-side adhesive layer 330 may be composed of, for example, Ti, Pt, Mo, Ni, or W in place of Ta.

<N-Side Electrode>

Subsequently, configuration of the n-side electrode 400 will be described in detail. As described above, the n-side electrode 400 includes: the n-side joining layer 410; the n-side bonding pad electrode 420 (the n-side diffusion barrier layer 421 and the n-side connecting electrode layer 422); and the n-side adhesive layer 430. The n-side electrode 400 also serves as a so-called bonding pad, and is configured so that a bonding wire not shown in the figure is connected to the n-side connecting surface 423 that is exposed to the outside.

It should be noted that, in this example, in a planar view as shown in FIG. 2, the n-side electrode 400 is formed into a circle. However, similarly to the p-side electrode 300 as described above, it is possible to select any shape.

In the exemplary embodiment, the n-side electrode 400 has the same configuration as the p-side electrode 300. Accordingly, the n-side joining layer 410 as an example of a first joining layer, the n-side diffusion barrier layer 421 as an example of a first diffusion barrier layer constituting the n-side bonding pad electrode 420 as an example of a first connecting electrode, the n-side connecting electrode layer 422 as an example of a first connecting electrode layer and the n-side adhesive layer 430 as an example of a first adhesive layer are configured with the same materials as the p-side joining layer 310, the p-side diffusion barrier layer 321, the p-side connecting electrode layer 322 and the p-side adhesive layer 330, respectively.

(Method of Manufacturing Semiconductor Light Emitting Element)

Next, an example of a method of manufacturing the semiconductor light emitting element 1 shown in FIG. 1 will be described.

The method of manufacturing the semiconductor light emitting element 1 in the exemplary embodiment includes: a laminated semiconductor layer forming process in which the laminated semiconductor layer 100 including the light emitting layer 150 is formed on the substrate 110; an exposure surface forming process in which the semiconductor layer exposure surface 140c is formed by cutting out a part of the laminated semiconductor layer 100; a transparent electrode forming process in which the transparent electrode 170 is formed on the laminated semiconductor layer 100 except for the semiconductor layer exposure surface 140c; an electrode forming process in which the p-side electrode 300 is formed on the transparent electrode 170 and the n-side electrode 400 is formed on the semiconductor layer exposure surface 140c; and a protecting layer forming process in which the protecting layer 180 is formed.

Among them, the laminated semiconductor layer forming process includes: an intermediate layer forming process in which the intermediate layer 120 is formed; a base layer forming process in which the base layer 130 is formed; the n-type semiconductor layer forming process in which the n-type semiconductor layer 140 is formed; the light emitting layer forming process in which the light emitting layer 150 is formed; and the p-type semiconductor layer forming process in which the p-type semiconductor layer 160 is formed.

The aforementioned electrode forming process includes: a joining layer forming process in which the p-side joining layer 310 is formed on a part of the transparent electrode 170 and the n-side joining layer 410 is formed on the semiconductor layer exposure surface 140c; a diffusion barrier layer forming process in which the p-side diffusion barrier layer 321 is formed on the p-side joining layer 310 and the n-side diffusion barrier layer 421 is formed on the n-side joining layer 410; a connecting electrode layer forming process in which the p-side connecting electrode layer 322 is formed on the p-side diffusion barrier layer 321 and the n-side connecting electrode layer 422 is formed on the n-side diffusion barrier layer 421; and an adhesive layer forming process in which the p-side adhesive layer 330 is formed on the p-side connecting electrode layer 322 except for the p-side connecting surface 323 and the n-side adhesive layer 430 is formed on the n-side connecting electrode layer 422 except for the n-side connecting surface 423.

The method of manufacturing the semiconductor light emitting element 1 to which the exemplary embodiment is applied may further include an annealing process in which the resultant semiconductor light emitting element is subjected to heat treatment after the adhesive layer forming process, as necessary.

Hereinafter, respective processes will be described in sequence.

<Laminated Semiconductor Layer Forming Process>

The laminated semiconductor layer forming process is constituted by the intermediate layer forming process, the base layer forming process, the n-type semiconductor layer forming process, the light emitting layer forming process and the p-type semiconductor layer forming process.

<Intermediate Layer Forming Process>

First, the substrate 110 which is a sapphire substrate or the like is prepared and is subjected to preprocessing. The preprocessing can be performed by a method of, for example, placing the substrate 110 in a chamber of a sputtering device and conducting sputtering before forming the intermediate layer 120. Specifically, preprocessing for cleaning the top surface of the substrate 110 by exposing the substrate 110 in plasma of Ar or $N_2$ may be performed in the chamber. Organic substances or oxides adhered to the top surface of the substrate 110 can be removed by the action of plasma of Ar gas or $N_2$ gas on the substrate 110.

Next, on the top surface of the substrate 110, the intermediate layer 120 is laminated by the sputtering method.

In the case of forming the intermediate layer 120 having a single crystal structure by the sputtering method, as for the ratio between a nitrogen material and a flow rate of the nitrogen with respect to inert gases in the chamber, the nitrogen material desirably accounts for 50% to 100%, and more desirably 75%.

Further, in the case of forming the intermediate layer 120 having columnar crystals (polycrystals) by the sputtering method, as for the ratio between a nitrogen material and a flow rate of the nitrogen with respect to inert gases in the chamber, the nitrogen material desirably accounts for 1% to 50%, and more desirably 25%. It should be noted that the intermediate layer 120 can be formed not only by the aforementioned sputtering method, but also by the MOCVD method.

<Base Layer Forming Process>

Next, after forming the intermediate layer 120, the base layer 130 of a single crystal is formed on the top surface of the substrate 110 on which the intermediate layer 120 has been formed. The base layer 130 may be formed by the sputtering method or the MOCVD method.

<N-Type Semiconductor Layer Forming Process>

After forming the base layer 130, the n-type semiconductor layer 140 is formed by laminating the n-contact layer 140a and the n-cladding layer 140b. The n-contact layer 140a and the n-cladding layer 140b may be formed by the sputtering method or the MOCVD method.

<Light Emitting Layer Forming Process>

Formation of the light emitting layer 150 may be performed by either method of sputtering or MOCVD, but especially, the MOCVD method is preferred. Specifically, the barrier layers 150a and the well layers 150b may be alternately and repeatedly laminated such that the barrier layers 150a are located to face the n-type semiconductor layer 140 and the p-type semiconductor layer 160.

<P-Type Semiconductor Layer Forming Process>

Further, formation of the p-type semiconductor layer 160 may be performed by either method of sputtering or MOCVD. Specifically, the p-cladding layers 160a and the p-contact layers 160b may be laminated in turn.

<Exposure Surface Forming Process>

Prior to forming the transparent electrode 170, the semiconductor layer exposure surface 140c is formed by performing patterning by a publicly known photolithographic method, etching a part of the laminated semiconductor layer 100 in a predetermined region, and exposing a part of the n-contact layer 140a.

<Transparent Electrode Forming Process>

The transparent electrode 170 is formed by use of a publicly known method such as the sputtering method on the p-type semiconductor layer 160, which is not removed by etching to be left, while covering the semiconductor layer exposure surface 140c with a mask or the like. It should be noted that the semiconductor layer exposure surface 140c may be formed by, after the transparent electrode 170 is formed on the p-type semiconductor layer 160 in advance, removing a part of the laminated semiconductor layer 100 as well as a part of the transparent electrode 170 from a predetermined region by etching.

<Electrode Forming Process>

The electrode forming process includes: the joining layer forming process; the diffusion barrier layer forming process; the connecting electrode layer forming process; the peeling process; and the adhesive layer forming process.

FIGS. 4A to 4G are diagrams for illustrating the joining layer forming process, the diffusion barrier layer forming process, the connecting electrode layer forming process, the peeling process and the adhesive layer forming process in the electrode forming process, and the protecting layer forming process and the bonding pad connecting surface exposing process that are subsequently conducted.

Figure 4A:
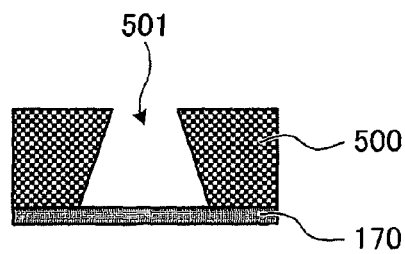
FIGS. 4A to 4G are diagrams for illustrating the joining layer forming process, the diffusion barrier layer forming process, the connecting electrode layer forming process and the adhesive layer forming process in the electrode forming process, and the protecting layer forming process that is subsequently conducted.

First, as shown in FIG. 4A, a reverse-tapered mask (hereinafter, referred to as a hardened portion as necessary) 500 in which an opening portion 501 having a diameter larger in a lateral direction as the transparent electrode 170 side approaches is formed on the transparent electrode 170. The opening portion 501 is formed at a section corresponding to the region where the p-side electrode 300 is formed. At this time, a reverse-tapered mask 500 having the similar opening portion 501 is also formed at a section for forming the n-side electrode 400 in the semiconductor layer exposure surface 140c, although it is not shown in the figure.

It should be noted that, in the exemplary embodiment, the shapes of the p-side electrode 300 formed in the opening portion 501 and the n-side electrode 400 formed in another opening portion 501 are devised by adding a twist to the shape of the opening portion 501 of the reverse-tapered mask 500. However, it will be described later.

As for the method of forming the reverse-tapered mask 500, a description with a specific example will be given here. As the method of forming the reverse-tapered mask 500 as described above, there are publicly known methods such as a method of using a positive resist and a method of using a negative resist. However, the method of using a negative photoresist will be described here. It should be noted that, although the mask formation on the transparent electrode 170 side will be described below, respective processes are also conducted on the semiconductor layer exposure surface 140c side at a time.

FIGS. 5A to 5E are diagrams for illustrating the process of forming the reverse-tapered mask 500 shown in FIG. 4A.

<Mask Forming Process>

The mask forming process includes: a resist coating process in which a resist is applied to the transparent electrode 170 (and the semiconductor layer exposure surface 140c) to form an insoluble resist portion 510; a partial exposing process in which exposure is conducted by masking a part of the insoluble resist portion 510 and thereby the exposed insoluble resist portion 510 turns to a soluble resist portion 520; a hardening process in which the soluble resist portion 520 is hardened by heating; a full exposing process in which the resist portion is fully exposed and thereby the insoluble resist portion 510 turns to the soluble resist portion 520; and a peeling process in which the soluble resist portion 520 is peeled off by soaking in a resist-peeling solution.

<Resist Coating Process>

Figure 5A:
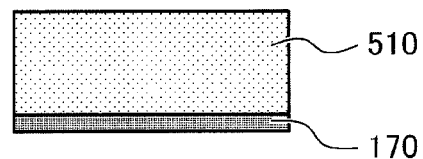
FIGS. 5A to 5E are diagrams for illustrating the mask forming process.

First, as shown in FIG. 5A, a resist is applied onto the transparent electrode 170, and then it is dried to form the insoluble resist portion 510.

As a negative photoresist, for example, AZ5200NJ (product name: manufactured by AZ electronic materials) or the like can be used.

<Partial Exposing Process>

Figure 5B:
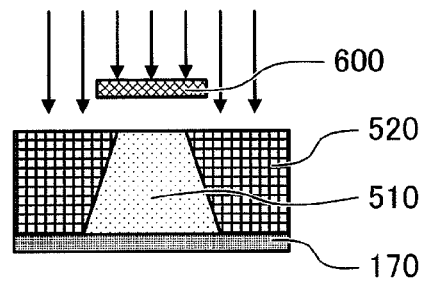

Next, as shown in FIG. 5B, a mask 600 is arranged on the front surface of the insoluble resist portion 510 so as to cover a position where the p-side electrode 300 is formed, irradiation from the mask 600 side toward the transparent electrode 170 side is conducted with light having certain intensity and wavelength as shown with arrows, and thereby a section of the insoluble resist portion 510, which was irradiated with light, is photoreacted and turns to the soluble resist portion 520.

This photoreaction proceeds in response to the light intensity, and thus the photoreaction proceeds at a fast rate on the light irradiation surface side, and the photoreaction proceeds at a slow rate on the transparent electrode 170 side. Accordingly, as shown in FIG. 5B, the soluble resist portion 520 is formed into a reverse tapered shape having lateral distance larger as the transparent electrode 170 approaches, from the part which the mask 600 covers toward the transparent electrode 170.

It should be noted that the masked portion remains as the insoluble resist portion 510 with no change.

<Hardening Process>

Figure 5C:
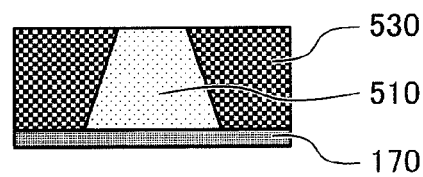

Next, the insoluble resist portion 510 and the soluble resist portion 520 on the transparent electrode 170 are heated by, for example, a hot plate, an oven or the like, and thereby, as shown in FIG. 5C, the soluble resist portion 520 is cross-linked by heat reaction to be hardened, and turns to the hardened portion 530. At this time, the insoluble resist portion 510 maintains its original state.

<Fully Exposing Process>

Figure 5D:
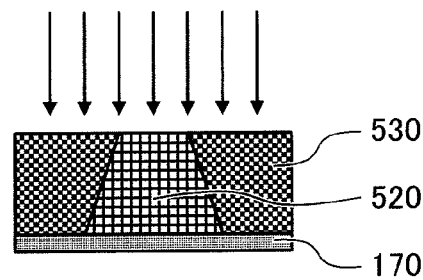

Subsequently, as shown in FIG. 5D, irradiation without a mask is conducted with light from a front surface sides of the insoluble resist portion 510 and the hardened portion 530 composed of the cross-linked polymer, and thereby the insoluble resist portion 510 which was not converted into the soluble resist portion 520 in FIG. 5B is photoreacted, and turns to the soluble resist portion 520.

<Peeling Process>

Figure 5E:
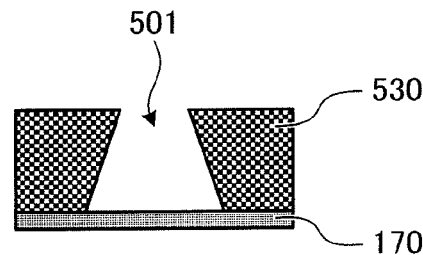

Finally, the soluble resist portion 520 is solved and removed by a certain developer, and thereby, as shown in FIG. 5E, the hardened portion 530 having the reverse-tapered opening portion 501, that is, the reverse-tapered mask 500 (refer to FIG. 4A) can be formed on the transparent electrode 170.

The description is continued by returning to FIGS. 4A to 4G.

In the exemplary embodiment, in the same batch processing, the p-side joining layer 310 and the n-side joining layer 410, the p-side diffusion barrier layer 321 and the n-side diffusion barrier layer 421, and the p-side connecting electrode layer 322 and the n-side connecting electrode layer 422 are sequentially formed in this order by use of the sputtering method. In other words, the joining layer forming process, the diffusion barrier layer forming process and the connecting electrode layer forming process are conducted in sequence. More specifically, a sputtering target for forming the p-side joining layer 310 and the n-side joining layer 410, a sputtering target for forming the p-side diffusion barrier layer 321 and the n-side diffusion barrier layer 421, a sputtering target for forming the p-side connecting electrode layer 322 and the n-side connecting electrode layer 422, and a sputtering target for forming the p-side adhesive layer 330 and the n-side adhesive layer 430 are provided in the chamber of the sputtering device in advance. In this state, the substrate 110 in which the laminated semiconductor layer 100, the transparent electrode 170 and the reverse-tapered mask 500 has been formed is set in this chamber, and respective layers are formed while the sputtering target to be plasmatized is changed in turn. It should be noted that, although a description will be given for formation of respective layers on the transparent electrode 170 side, the respective processes are also conducted on the semiconductor layer exposure surface 140c side at a time.

In the following description, second distance between the transparent electrode 170 and the sputtering target for the p-side diffusion barrier layer 321 is set to be smaller than first distance between the transparent electrode 170 and the sputtering target for the p-side joining layer 310. Further, third distance between the transparent electrode 170 and the sputtering target for the p-side connecting electrode layer 322 is set to be smaller than the second distance.

<Joining Layer Forming Process>

Figure 4B:
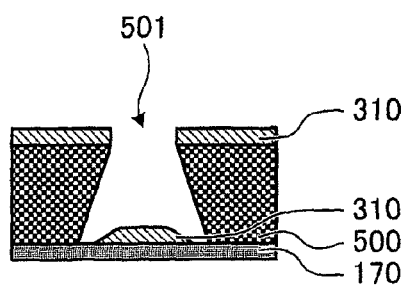

In the state where the sputtering target for the p-side joining layer 310 and the reverse-tapered mask 500 are made to face each other, the p-side joining layer 310 is formed on the top surface of the transparent electrode 170 and the reverse-tapered mask 500 by the sputtering method, as shown in FIG. 4B. In the exemplary embodiment, a Ta target and a Pt target are used as the sputtering target, and the p-side joining layer 310 formed of a TaN—Pt mixed layer is formed by co-sputtering under an Ar gas atmosphere including a small amount of $N_2$ gas. It should be noted that a TaN target may be used instead of the Ta target. In this case, together with the Pt target, co-sputtering may be conducted under an Ar gas atmosphere including a small amount of $N_2$ gas or an Ar gas atmosphere.

In a case where a NbN—Pt mixed layer, a TiN—Pt mixed layer, a WN—Pt mixed layer or a MoN—Pt mixed layer is formed as the p-side joining layer 310, co-sputtering may be conducted under an Ar gas atmosphere including a small amount of $N_2$ gas by use of a target composed of a desired metal (Nb, Ti, W or Mo) and the Pt target. Instead, a target composed of a desired metallic nitride (NbN, TiN, WN, MoN) can be used. In this case, together with the Pt target, co-sputtering may be conducted under an Ar gas atmosphere including a small amount of $N_2$ gas or an Ar gas atmosphere.

On the other hand, in a case where a Ta—Pt mixed layer is formed as the p-side joining layer 310, co-sputtering may be conducted under an Ar gas atmosphere by use of the Ta target and the Pt target.

In the joining layer forming process, distance between the sputtering target and the transparent electrode 170 is set as the first distance. Thereby, the p-side joining layer 310 is formed on the transparent electrode 170 so that a region just below the entrance of the opening portion 501 is thick and a peripheral region thereof is thin. As a result, in the p-side joining layer 310 laminated on the transparent electrode 170, a top surface that is almost flat and an inclined surface spreading from the periphery thereof to the outside are formed. However, the p-side joining layer 310 is hardly formed on an outer peripheral side of the transparent electrode 170 exposed on the lowest side of the opening portion 501, and thus a state in which the transparent electrode 170 is exposed is maintained.

<Diffusion Barrier Layer Forming Process>

Figure 4C:
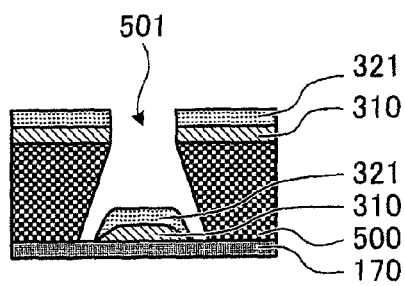

Subsequently, in a state where the sputtering target for the p-side diffusion barrier layer 321 and the reverse-tapered mask 500 are made to face each other, the p-side diffusion barrier layer 321 is formed on the top surface of the p-side joining layer 310 on the transparent electrode 170 and the reverse-tapered mask 500 by the sputtering method, as shown in FIG. 4C. In the exemplary embodiment, the Pt target is used as the sputtering target, and sputtering is conducted under an Ar gas atmosphere.

In the diffusion barrier layer forming process, distance between the sputtering target and the transparent electrode 170 is set as the second distance. Thereby, the p-side diffusion barrier layer 321 is formed on the p-side joining layer 310 formed on the transparent electrode 170 so that a region just below the entrance of the opening portion 501 is thick and a peripheral region thereof is thin. In addition, since the distance between the sputtering target and the transparent electrode 170 is made to be closer than that in a case of forming the p-side joining layer 310, the p-side diffusion barrier layer 321 is formed in a state of spreading in a plane direction of the transparent electrode 170 further than the p-side joining layer 310. As a result, in the p-side diffusion barrier layer 321 laminated on the p-side joining layer 310, a top surface that is almost flat and an inclined surface spreading from the periphery thereof to the outside are formed. In addition, along with spreading of the p-side diffusion barrier layer 321 in the plane direction further than the p-side joining layer 310, the whole edge of the p-side diffusion barrier layer 321 on the outer peripheral side comes into contact with the transparent electrode 170, and the p-side diffusion barrier layer 321 completely covers the p-side joining layer 310 together with the transparent electrode 170. However, the p-side diffusion barrier layer 321 is hardly formed on an outer peripheral side of the transparent electrode 170 exposed on the lowest side of the opening portion 501, and thus a state in which the transparent electrode 170 is exposed is still maintained.

<Connecting Electrode Layer Forming Process>

Figure 4D:
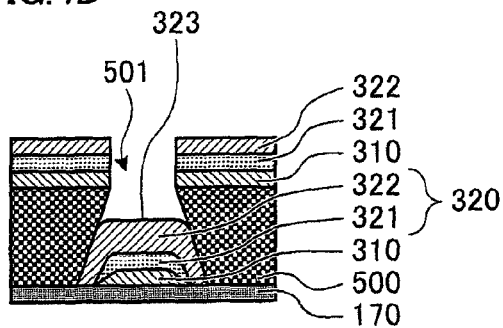

Subsequently, in a state where the sputtering target for the p-side connecting electrode layer 322 and the reverse-tapered mask 500 are made to face each other, the p-side connecting electrode layer 322 is formed on the top surface of the p-side diffusion barrier layer 321 on the transparent electrode 170 and the reverse-tapered mask 500 by the sputtering method, as shown in FIG. 4D. In the exemplary embodiment, an Au target is used as the sputtering target, and sputtering is conducted under an Ar gas atmosphere.

In the connecting electrode layer forming process, distance between the sputtering target and the transparent electrode 170 is set as the third distance. Thereby, the p-side connecting electrode layer 322 is formed on the p-side diffusion barrier layer 321 formed on the transparent electrode 170 so that a region just below the entrance of the opening portion 501 is thick and a peripheral region thereof is thin. In addition, since the distance between the sputtering target and the transparent electrode 170 is made to be closer than that in a case of forming the p-side diffusion barrier layer 321, the p-side connecting electrode layer 322 is formed so as to spread in a plane direction of the transparent electrode 170 further than the p-side diffusion barrier layer 321 and fill space on a lower side of an inner wall of the opening portion 501. As a result, in the p-side connecting electrode layer 322 laminated on the p-side diffusion barrier layer 321, the p-side connecting surface 323 as a top surface that is almost flat and an inclined surface spreading from the periphery thereof to the outside are formed. In addition, along with spreading of the p-side connecting electrode layer 322 in the plane direction further than the p-side diffusion barrier layer 321, the whole edge of the p-side connecting electrode layer 322 on the outer peripheral side comes into contact with the transparent electrode 170, and the p-side connecting electrode layer 322 completely covers the p-side diffusion barrier layer 321 together with the transparent electrode 170.

<Peeling Process>

Figure 4E:
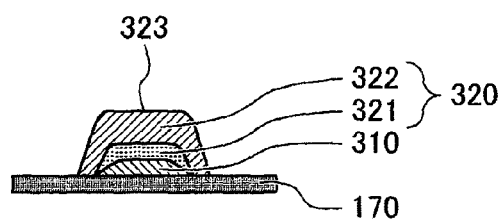

Subsequently, the reverse-tapered mask 500 composed of a cross-linked polymer is peeled off by soaking, in the resist peeling solution, the substrate 110 having been subjected to the connecting electrode layer forming process. Thereby, as shown in FIG. 4E, a state where the p-side bonding pad electrode 320 (formed of the p-side diffusion barrier layer 321 and the p-side connecting electrode layer 322) including the p-side joining layer 310 is exposed is achieved on the transparent electrode 170.

<Adhesive Layer Forming Process>

Figure 4F:
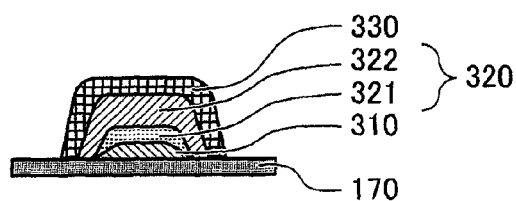

Subsequently, a mask having an opening portion at the exposed p-side bonding pad electrode 320 and the periphery thereof is formed on the substrate 110 having been subjected to the peeling process. Then, in a state where the sputtering target for the p-side adhesive layer 330 and the substrate 110 with the mask formed thereon are made to face each other, a film is formed by using a publicly known method such as the sputtering method. The mask is then peeled off, and thereby the p-side adhesive layer 330 is formed as shown in FIG. 4F. In a case where the p-side adhesive layer 330 is formed by the sputtering method, sputtering may be conducted by use of the Ta target as the sputtering target under the Ar gas atmosphere.

As described above, the p-side electrode 300 having the p-side joining layer 310, the p-side bonding pad electrode 320 (the p-side diffusion barrier layer 321 and the p-side connecting electrode layer 322) and the p-side adhesive layer 330 is formed on the transparent electrode 170. It should be noted that, although the detailed description was not given, the n-side electrode 400 having the n-side joining layer 410, the n-side bonding pad electrode 420 (the n-side diffusion barrier layer 421 and the n-side connecting electrode layer 422) and the n-side adhesive layer 430 is formed on the semiconductor layer exposure surface 140c through the same process.

<Protecting Layer Forming Process>

The protecting layer 180 composed of $SiO_2$ is formed by the sputtering method on the region where the transparent electrode 170 is formed, the p-side bonding pad electrode 320 and the n-side bonding pad electrode 420, and the semiconductor layer exposure surface 140c.

<Bonding Pad Connecting Surface Exposing Process>

Figure 4G:
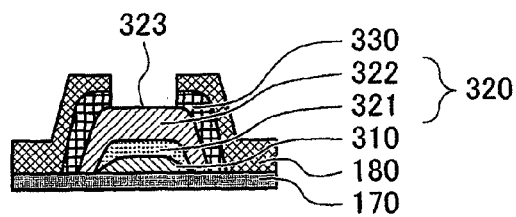

Then, the region except for the portions where the p-side connecting surface 323 and the n-side connecting surface 423 are to be formed is covered with a mask, and etching is conducted on the protecting layer 180 and the adhesive layer (the p-side adhesive layer 330 and the n-side adhesive layer 430) existing at these portions to expose a part of each of the p-side connecting electrode layer 322 and the n-side connecting electrode layer 422. Accordingly, as shown in FIG. 4G, the p-side connecting electrode layer 322 except for the p-side connecting surface 323 is covered with the p-side adhesive layer 330, and a state where the p-side connecting surface 323 is exposed at the central portion of the p-side adhesive layer 330 is achieved. Additionally, the n-side connecting electrode layer 422 except for the n-side connecting surface 423 is covered with the n-side adhesive layer 430, and a state where the n-side connecting surface 423 is exposed at the central portion of the n-side adhesive layer 430 is achieved.

<Annealing Process>

Then, the semiconductor light emitting element 1 thus obtained is subjected to an annealing treatment at the temperature of not less than 150 degrees C. and not more than 600 degrees C., and more preferably at the temperature of not less than 200 degrees C. and not more than 500 degrees C., under a reductive atmosphere such as nitrogen. This annealing processing may be conducted for enhancing adhesiveness between the transparent electrode 170 and the p-side bonding pad electrode 320 through the p-side joining layer 310 and adhesiveness between the semiconductor layer exposure surface 140c and the n-side bonding pad electrode 420 through the n-side joining layer 410.

As described above, the semiconductor light emitting element 1 is obtained.

In a case of using, as a lamp or the like, the semiconductor light emitting element 1 thus obtained, after the substrate 110 side is die-bonded to a base of the lamp, a bonding wire formed of a gold wire is connected to the p-side connecting surface 323 of the p-side bonding pad electrode 320 through a golden ball, and a bonding wire formed of a gold wire is connected to the n-side connecting surface 423 the n-side bonding pad electrode 420 through a golden ball in a similar manner. Here, the diameter of the gold wire used here is about 10 to 30 μm.

By passing a current through the semiconductor light emitting element 1 via both of the golden wires, the light emitting layer 150 emits light.

Next, a description will be given for examples of the present invention. However, this invention is not limited to these examples.

The inventors manufactured the semiconductor light emitting elements 1 in which manufacturing conditions of the p-side joining layer 310 constituting the p-side electrode 300 and the n-side joining layer 410 constituting the n-side electrode 400 are varied, and considered the adhesiveness between the transparent electrode 170 and the p-side bonding pad electrode 320 in the p-side electrode 300, ohmic-contact characteristics between the transparent electrode 170 and the p-side bonding pad electrode 320 in the p-side electrode 300, and forward voltage Vf of each of the semiconductor light emitting elements 1, by use of a method described below.

FIG. 6 shows manufacturing conditions of the p-side joining layer 310 and the n-side joining layer 410 (simply referred to as a "joining layer" in the description below), configuration of the resultant joining layers, and relationship with the evaluation results thus obtained, in examples 1 to 14 and comparative examples 1 and 2.

In FIG. 6, a $N_2$ gas concentration in a sputtering gas at the joining layer forming process, that is, at the co-sputtering in which the Ta target and the Pt target are used is shown as a manufacturing condition of the joining layer. Further, in FIG. 6, a composition ratio between Ta and Pt in the joining layer (a composition ratio in the joining layer) and the thickness of the joining layer are shown as the configuration of the resultant joining layers.

Furthermore, in FIG. 6, results of a peeling test regarding the p-side bonding pad electrode 320 are shown as the number of occurrences of peeled electrodes, as for the evaluation result. This peeling test was conducted by observing whether the p-side bonding pad electrode 320 is peeled from the transparent electrode 170 or not when scratched with a shearing tool from the lateral direction after wire-bonding at a position displaced from a center of the p-side connecting surface 323 of the p-side bonding pad electrode 320 by 40 μm by use of a publicly known wire bonder. The number of samples in each of the examples and comparative examples was set at 300, and how often errors (failure) occurred was checked. In the description of FIG. 6, the number of samples is set as a denominator, and the number of occurrences of error is set as a numerator.

Furthermore, in FIG. 6, contact resistivity (n-side electrode contact resistivity NN) between the n-contact layer 140a made of GaN doped with n-type impurities and the n-side joining layer 410 is shown as another evaluation result.

Accordingly, it is indicated that, as the value of the n-side electrode contact resistivity NN is closer to zero, ohmic contact between the n-contact layer 140a and the n-side electrode 400 is ensured.

Still furthermore, in FIG. 6, forward voltage Vf when a forward current of 20 mA is supplied to the semiconductor light emitting element 1 is shown as still another evaluation result.

In each of the examples and comparative examples, IZO, Pt and Au were respectively used as the transparent electrode 170, the p-side diffusion barrier layer 321 and the n-side diffusion barrier layer 421, and the p-side connecting electrode layer 322 and the n-side connecting electrode layer 422. In addition, in each of the examples and comparative examples, Au was used as a bonding wire.

It should be noted that, an X-ray photoelectric analyzer (ESCA, XPS) was used for analysis of compositions of the joining layer of the electrode or the like, and conditions of nitride or oxide of metal such as Ta, Nb, Ti, W, Mo or the like were confirmed.

Since co-sputtering was conducted under an Ar gas atmosphere including $N_2$ gas by use of the Ta target and the Pt target in the examples 1 to 10, 12, and 13, the connecting layer is configured with a TaN—Pt mixed layer. Meanwhile, since co-sputtering was conducted under an Ar gas atmosphere by use of the Ta target and the Pt target in the examples 11, the connecting layer is configured with a Ta—Pt mixed layer. Further, the example 14 is a case where co-sputtering was conducted under an Ar gas atmosphere as with the example 1 and the composition ration in the joining layer (Ta:Pt) is set at 90:10, and the result in which a TaO—Pt mixed layer was formed by existence of TaO in the joining layer was obtained.

On the other hand, in the comparative example 1, since sputtering was conducted under an Ar gas atmosphere including $N_2$ gas by use of the only Ta target, the connecting layer is configured with a TaN layer which does not include Pt. In the comparative example 2, since the only Pt target is used, the connecting layer is formed of a Pt layer in spite of conducting sputtering under an Ar gas atmosphere including $N_2$ gas.

Next, a description will be given for the evaluation results.

First, in the examples 1 to 14, the number of peeled electrodes was not more than 10 with respect to the 300 samples, the n-side electrode contact resistivity NN was not more than 0.005, and the forward voltage Vf was not more than 3.35 V.

In contrast, in the comparative example 1, while similar results to the examples 1 to 14 could be obtained as for the n-side electrode contact resistivity NN and the forward voltage Vf, the number of the peeled electrodes was 49 with respect to the 300 samples, and thus it got worse than the examples 1 to 14.

In the comparative example 2, while similar results to the examples 1 to 14 could be obtained as for the number of the peeled electrodes, the forward voltage Vf was 4.12V, and the n-side electrode contact resistivity NN was 0.0064, which were worse than the examples 1 to 14.

As described above, it is understood that peeling of the electrode can be suppressed while deterioration of electrical characteristics is suppressed by using, as the joining layer, a TaN—Pt mixed layer, a Ta—Pt mixed layer or a TaO—Pt mixed layer.

Subsequently, a composition ratio between Ta and Pt in the joining layer will be considered.

The examples 1, 2, 7, 12 and 13 show a relationship when the $N_2$ gas concentration (2.5 mol %) in the sputtering gas and the thickness of the joining layer (4.0 nm) are set to be constant, and the composition ratio in the joining layer (Ta:Pt) is changed within the range of 90:10 to 30:70. Thereby, it is understood that the forward voltage Vf increases while the number of occurrences of peeled electrodes decreases in accordance with increase of the composition ratio of Pt to the joining layer. It should be noted that the n-side electrode contact resistivity NN is nearly unchanged in spite of the increase of the composition ratio of Pt to the joining layer. However, if the joining layer composition ratio is in the range of 90:10 to 30:70, preferable results could be obtained in all cases.

Next, the $N_2$ gas concentration in the sputtering gas will be considered. It should be noted that, in a case of increasing the $N_2$ gas concentration in the sputtering gas, the ratio of nitrogen in the TaN—Pt mixed layer forming the joining layer is to increase.

The examples 3 to 5 and 7 show a relationship when the composition ratio in the joining layer (50:50) and the thickness of the joining layer (4.0 nm) are set to be constant, and the N₂ gas concentration in the sputtering gas is changed within a range of 2.5 mol % to 10.0 mol %. The example 11 shows a case where the composition ratio in the joining layer (50:50) and the thickness of the joining layer (4.0 nm) are set to be constant similarly to the examples 3, 4, 5 and 7, and the N₂ gas concentration in the sputtering gas is set at 0.0 mol %. Thereby, it is understood that the n-side electrode contact resistivity NN decreases and the forward voltage Vf also decreases in accordance with decrease of the N₂ gas concentration in the sputtering gas. It should be noted that the number of occurrences of peeled electrodes is nearly unchanged in spite of the decrease of the N₂ gas concentration in the sputtering gas. However, if the N₂ gas concentration in the sputtering gas is in a range of 0.0 mol % to 10.0 mol %, preferable results could be obtained in all cases.

In the example 14, the number of occurrences of peeled electrodes was 7, the n-side electrode contact resistivity NN was 0.0025, and the forward voltage Vf was 3.18 V. Thus, a preferable result could be obtained.

Finally, the thickness of the joining layer will be considered.

The examples 6 to 10 show a relationship when the composition ratio in the joining layer (50:50) and the N₂ gas concentration in the sputtering gas (2.5 mol %) are set to be constant, and the thickness of the joining layer is changed within the range of 1.0 nm to 100 nm. Thereby, it is understood that, in accordance with increase of the thickness of the joining layer, the forward voltage Vf increases while the n-side electrode contact resistivity NN decreases. It should be noted that the number of occurrences of peeled electrodes is nearly unchanged in spite of the increase of the thickness of the joining layer. However, if the thickness of the joining layer is in a range of 1.0 nm to 100 nm, preferable results could be obtained in all cases.

It should be noted that, similar results to the examples 1 to 14 could be obtained in a case where the joining layer was configured by use of Nb, Ti, W, or Mo instead of Ta, although a detailed description is not given here.

Further, as for the n-side electrode 400 having the configuration shown in each of the examples 1 to 14, it is possible to increase adhesiveness with the n-contact layer 140a and ensure ohmic contact characteristics by providing the n-side joining layer 410. However, the detailed description is not given here.

As described above, in the exemplary embodiment, it is possible to simplify the configuration by using a common structure for two electrodes and suppress deterioration of electrical characteristics of the semiconductor light emitting element 1 while a joining property of each electrode is improved. However, in any one of the p-side electrode 300 and the n-side electrode 400 out of the two electrodes, it is possible to suppress deterioration of the electrical characteristics of the semiconductor light emitting element 1 while the joining property of each electrode is improved.

REFERENCE SIGNS LIST

1 . . . Semiconductor light emitting element
100 . . . Laminated semiconductor layer
110 . . . Substrate
120 . . . Intermediate layer
130 . . . Base layer
140 . . . N-type semiconductor layer
150 . . . Light emitting layer
160 . . . P-type semiconductor layer
170 . . . Transparent electrode
180 . . . Protecting layer
300 . . . P-side electrode
310 . . . P-side joining layer
320 . . . P-side bonding pad electrode
321 . . . P-side diffusion barrier layer
322 . . . P-side connecting electrode layer
323 . . . P-side connecting surface
330 . . . P-side adhesive layer
400 . . . N-side electrode
410 . . . N-side joining layer
420 . . . N-side bonding pad electrode
421 . . . N-side diffusion barrier layer
422 . . . N-side connecting electrode layer
423 . . . N-side connecting surface
430 . . . N-side adhesive layer

The invention claimed is:

1. A semiconductor light emitting element comprising:
a first semiconductor layer that has a first conductivity type;
a light emitting layer that is laminated on one surface of the first semiconductor layer so that a part of the one surface is exposed;
a second semiconductor layer that has a second conductivity type different from the first conductivity type and is laminated on the light emitting layer;
a transparent electrode that includes oxide of indium, has transparency to light output from the light emitting layer, and is laminated on the second semiconductor layer;
a first joining layer that includes Pt and nitride of at least one kind of metal selected from among Ta, Nb, Ti, W and Mo, and is laminated on the first semiconductor layer;
a first connecting electrode that is laminated on the first joining layer, and is used for electric connection with an outside;
a second joining layer that is composed of the same material as the first joining layer, and is laminated on the transparent electrode; and
a second connecting electrode that is composed of the same material as the first connecting electrode, is laminated on the second joining layer, and is used for electric connection with an outside,
wherein
the first connecting electrode includes a first diffusion barrier layer that is composed of Pt, and is laminated on the first joining layer, and a first connecting electrode layer that is composed of Au or an alloy including Au, is laminated on the first diffusion barrier layer, and is used for the electric connection with the outside, and
the second connecting electrode includes a second diffusion barrier layer that is composed of the same Pt as the first diffusion barrier layer, and is laminated on the second joining layer, and a second connecting electrode layer that is composed of the same Au or alloy including Au as the first connecting electrode layer, is laminated on the second diffusion barrier layer, and is used for the electric connection with the outside.

2. The semiconductor light emitting element according to claim 1, wherein the transparent electrode contains the oxide of indium and oxide of zinc.

3. The semiconductor light emitting element according to claim 1, further comprising:
a first adhesive layer that includes at least one kind of metal selected from among Ta, Ti, Pt, Mo and Ni, and is laminated on a region of the first connecting electrode, except for a section used for the electric connection with the outside;
a second adhesive layer that is composed of the same material as the first adhesive layer, and is laminated on a region of the second connecting electrode, except for a section used for the electric connection with the outside; and a protecting layer that is provided so as to cover the transparent electrode, the first adhesive layer and the second adhesive layer.

4. The semiconductor light emitting element according to claim 1, wherein, in a case where the first joining layer and the second joining layer include Pt and nitride of Ta, a composition ratio between the Ta and the Pt in each of the first joining layer and the second joining layer is in a range of 90:10 to 30:70 by weight.

5. A method for manufacturing a semiconductor light emitting element comprising:
- a process of forming, on a substrate, a first semiconductor layer that has a first conductivity type, a light emitting layer that is laminated on the first semiconductor layer, and a second semiconductor layer that has a second conductivity type opposite to the type of the first semiconductor layer and is laminated on the light emitting layer;
- a process of forming, on the second semiconductor layer, a transparent electrode that includes oxide of indium and has transparency to light output from the light emitting layer, and exposing the first semiconductor layer on the transparent electrode side;
- a process of laminating, on an exposed section of the first semiconductor layer, a first joining layer that includes Pt and nitride of at least one kind of metal selected from among Ta, Nb, Ti, W and Mo, and laminating, on the transparent electrode, a second joining layer that is composed of the same material as the first joining layer; and
- a process of laminating, on the first joining layer, a first connecting electrode that is used for electric connection with an outside, and laminating, on the second joining layer, a second connecting electrode that is composed of the same material as the first connecting electrode, wherein
the process of laminating the first connecting electrode and the second connecting electrode comprises:
- a process of laminating, on the first joining layer, a first diffusion barrier layer that is composed of Pt, and laminating, on the second joining layer, a second diffusion barrier layer that is composed of Pt; and
- a process of laminating, on the first diffusion barrier layer, a first connecting electrode layer that is composed of Au or an alloy including Au and is used for the electric connection with the outside, and laminating, on the second diffusion barrier layer, a second connecting electrode layer that is composed of Au or an alloy including Au and is used for electric connection with an outside.

6. The method for manufacturing the semiconductor light emitting element according to claim 5, wherein, in the process of laminating the transparent electrode, a layer including the oxide of indium and oxide of zinc is laminated.

7. The method for manufacturing the semiconductor light emitting element according to claim 5, further comprising:
after the process of laminating the first connecting electrode and the second connecting electrode, a process of laminating a first adhesive layer that includes at least one kind of metal selected from among Ta, Ti, Pt, Mo and Ni, on a region of the first connecting electrode, except for a section used for the electric connection with the outside, and laminating a second adhesive layer that includes at least one kind of metal selected from among Ta, Ti, Pt, Mo and Ni, on a region of the second connecting electrode, except for a section used for the electric connection with the outside.

8. The method for manufacturing the semiconductor light emitting element according to claim 5, wherein, in a case where a layer including Pt and nitride of Ta is laminated as the first joining layer and the second joining layer in the process of forming the first joining layer and the second joining layer, a composition ratio between the Ta and the Pt in each of the first joining layer and the second joining layer is set to be in a range of 90:10 to 30:70 by weight.

* * * * *